United States Patent
Lee et al.

(10) Patent No.: US 8,928,601 B2
(45) Date of Patent: Jan. 6, 2015

(54) ORGANIC LIGHT EMITTING DISPLAY APPARATUS AND METHOD OF MANUFACTURING THE SAME

(75) Inventors: Yul-Kyu Lee, Yongin (KR); Chun-Gi You, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 621 days.

(21) Appl. No.: 12/914,828

(22) Filed: Oct. 28, 2010

(65) Prior Publication Data

US 2011/0234509 A1    Sep. 29, 2011

(30) Foreign Application Priority Data

Mar. 23, 2010    (KR) .......................... 10-2010-0025868

(51) Int. Cl.
    G06F 3/041    (2006.01)
    H01L 27/32    (2006.01)
    G06F 3/044    (2006.01)

(52) U.S. Cl.
    CPC .............. *H01L 27/323* (2013.01); *G06F 3/041* (2013.01); *G06F 3/044* (2013.01); *G06F 2203/04103* (2013.01); *G06F 2203/04111* (2013.01)
    USPC ...................................... 345/173; 178/18.03

(58) Field of Classification Search
    CPC ............ G06F 2203/04111; G06F 2203/04103; G06F 3/044; G06F 3/041; G06F 3/0412; G06F 3/045; H01L 27/323
    USPC ............ 345/173–178, 104; 178/18.01–18.09, 178/18.11
    See application file for complete search history.

(56) References Cited

U.S. PATENT DOCUMENTS

| 7,876,037 B2 | 1/2011 | Koshihara et al. |
| 2003/0184526 A1* | 10/2003 | Nakajima et al. ............. 345/173 |
| 2004/0080267 A1* | 4/2004 | Cok .............................. 313/512 |
| 2005/0046622 A1* | 3/2005 | Nakanishi et al. ............ 345/173 |
| 2007/0240914 A1* | 10/2007 | Lai et al. .................... 178/18.06 |
| 2009/0213090 A1 | 8/2009 | Mamba et al. |
| 2010/0110041 A1 | 5/2010 | Jang |

FOREIGN PATENT DOCUMENTS

| JP | 2008-218142 A | 9/2008 |
| KR | 10-2002-0023540 A | 3/2002 |
| KR | 10-2008-0055240 A | 6/2008 |
| KR | 10-2009-0092695 A | 9/2009 |
| KR | 10-2010-0007717 A | 1/2010 |

OTHER PUBLICATIONS

Official Action issued by the Korean Industrial Patent Office dated Jul. 20, 2011 in Korean Patent Application No. 10-2010-0025868, 4 pages.

* cited by examiner

*Primary Examiner* — Stephen Sherman

(74) *Attorney, Agent, or Firm* — Knobbe Martens Olson & Bear LLP

(57) ABSTRACT

An organic light emitting display apparatus having a capacitive touch panel function, and a method of manufacturing the same is disclosed. The organic light emitting display apparatus includes a touch unit including a pixel region and a pad region, and an insulating layer formed only on a surface of the pixel region by using an open mask. The organic light emitting display apparatus is manufactured without performing a photolithography process on an insulating layer, thereby improving productivity of the manufacturing process.

18 Claims, 12 Drawing Sheets

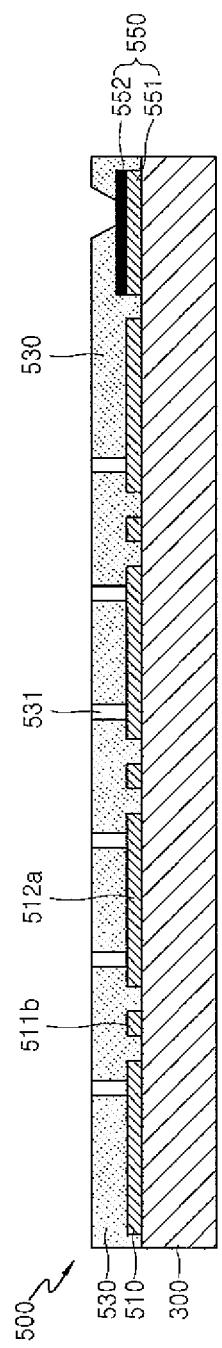

ORGANIC LIGHT EMITTING DISPLAY APPARATUS AND METHOD OF MANUFACTURING THE SAME

CROSS-REFERENCE TO RELATED APPLICATIONS

This application claims the benefit of Korean Patent Application No. 10-2010-0025868, filed on Mar. 23, 2010, in the Korean Intellectual Property Office, the disclosure of which is incorporated herein in its entirety by reference.

BACKGROUND

1. Field

The disclosed technology generally relates to an organic light emitting display apparatus, for example, an organic light emitting display apparatus having a touch panel capacitive function, and a method of manufacturing the organic light emitting display apparatus.

2. Description of the Related Technology

Conventional displays have been increasingly replaced with thin portable flat panel displays. Of the flat panel displays, an organic light emitting display apparatus is an emissive display that has received much attention because of it characteristics such as wide viewing angle, high contrast ratio, and short response time. Also, an organic light emitting display in which an emission layer comprises an organic material has better characteristics than an inorganic light emitting display apparatus in which an emission layer comprises an inorganic material in terms of brightness, driving voltage, response time, and multi-color display.

Research has been conducted into incorporating a touch panel function into an organic light emitting display apparatus to allow users to input instructions by touching a surface of a panel of the display apparatus with a finger or pen.

However, when the capacitive touch panel display apparatus is manufactured, various operations of a photo lithography process are required in order to make a sealing substrate with a touch panel function and thus the manufacturing process may be complicated. The present embodiments overcome the above problems as well as provide additional advantages.

SUMMARY OF CERTAIN INVENTIVE ASPECTS

One inventive aspect is an organic light emitting display apparatus comprising: a substrate; a display unit formed on the substrate; a sealing substrate covering the display unit; and a touch unit formed on the sealing substrate, wherein the touch unit comprises a pixel region comprising at least one surface and a pad region comprising at least one surface, first and second insulating layers, wherein the second insulating layer is formed only on the surface of the pixel region of the touch unit.

In some embodiments, the insulating layer is formed using an open mask that corresponds to the pixel regions, wherein the open mask corresponds to the pad regions when it is closed.

In some embodiments, the pad region comprises a connection portion to which a cable is connected.

In some embodiments, the connection portion comprises a first connection layer formed on the sealing substrate, a second connection layer formed on the first connection layer, and a third connection layer formed on the second connection layer contacting the cable.

In some embodiments, the first insulating layer is formed on the second connection layer, and the third connection layer is connected to the second connection layer through a contact hole formed through the first insulating layer formed on the second connection layer.

In some embodiments, the second connection layer comprises a metal material, and wherein the first connection layer and the third connection layer comprise an indium tin oxide (ITO) material.

In some embodiments, the pixel region comprises a first pattern layer formed on a first surface of the sealing substrate, wherein the first insulating layer is formed on the first pattern layer, and wherein a second pattern layer is formed between the first insulating layer and the second insulating layer.

In some embodiments, the first surface of the sealing substrate of the pixel region faces away from the substrate and a second surface of the sealing substrate faces toward the substrate.

In some embodiments, the first pattern layer comprises a first direction pattern portion and a second direction pattern portion that are disposed substantially perpendicularly to each other.

In some embodiments, any one of the first direction pattern portion and the second direction pattern portion is connected to the second pattern layer.

In some embodiments, the second pattern layer is connected to any one of the first direction pattern portion and the second direction pattern portion through a contact hole formed through the first insulating layer.

In some embodiments, the first and second pattern layers each comprise a transparent material, and wherein the first insulating layer and the second insulating layer comprise a SiO2 material.

In some embodiments, the first and second pattern layers each comprise ITO, IZO, ZnO or $In_2O_3$.

In some embodiments, the first and second pattern layers each comprise ITO.

Some embodiments further comprise a flexible printed circuit board connected to the cable.

Some embodiments further comprise a display drive integrated circuit (IC) and a touch unit drive IC that are connected to the flexible printed circuit board.

In some embodiments, the display unit comprises: a thin film transistor formed on the substrate; and an organic light emitting device coupled to the thin film transistor, wherein the organic light emitting device comprises an opposite electrode, a pixel electrode, and an intermediate layer formed between the opposite electrode and the pixel electrode.

Some embodiments relate to a method of manufacturing an organic light emitting display apparatus, the method comprising: providing a substrate; disposing a display unit on the substrate; preparing a sealing substrate for covering the display unit disposed on the substrate; forming a touch unit comprising a pixel region for touch manipulation, and a pad region for connection with a cable, wherein the forming of the touch unit comprises: twilling a connection portion in the pad region to which the cable is connected; positioning an open mask that is closed to correspond to the pad region and is open to correspond to the pixel region; and forming a first insulating layer on the pixel region and not on the pad region through the open portion of the open mask.

In some embodiments, the forming of the connection portion comprises: forming a first connection layer on the sealing substrate; forming a second connection layer comprising metal on the first connection layer; and forming a third connection layer on the second connection layer so as to be exposed to contact the cable.

Some embodiments further comprise forming a second insulating layer on the second connection layer; forming a contact hole in the insulating layer formed on the second connection layer; and connecting the third connection layer and the second connection layer through the contact hole.

BRIEF DESCRIPTION OF THE DRAWINGS

The above and other features and advantages of exemplary embodiments are described below with reference to the attached drawings in which.

DETAILED DESCRIPTION OF CERTAIN INVENTIVE EMBODIMENTS

Hereinafter, the present invention will be described in detail by explaining exemplary embodiments with reference to the attached drawings.

Figure 1:
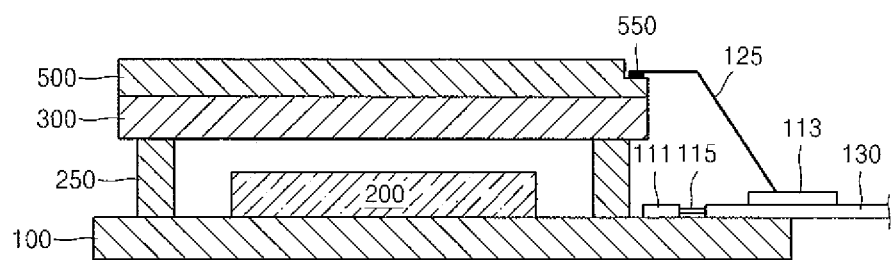
FIG. 1 is a cross-sectional view of an organic light emitting display apparatus according to an embodiment.
Figure 2:
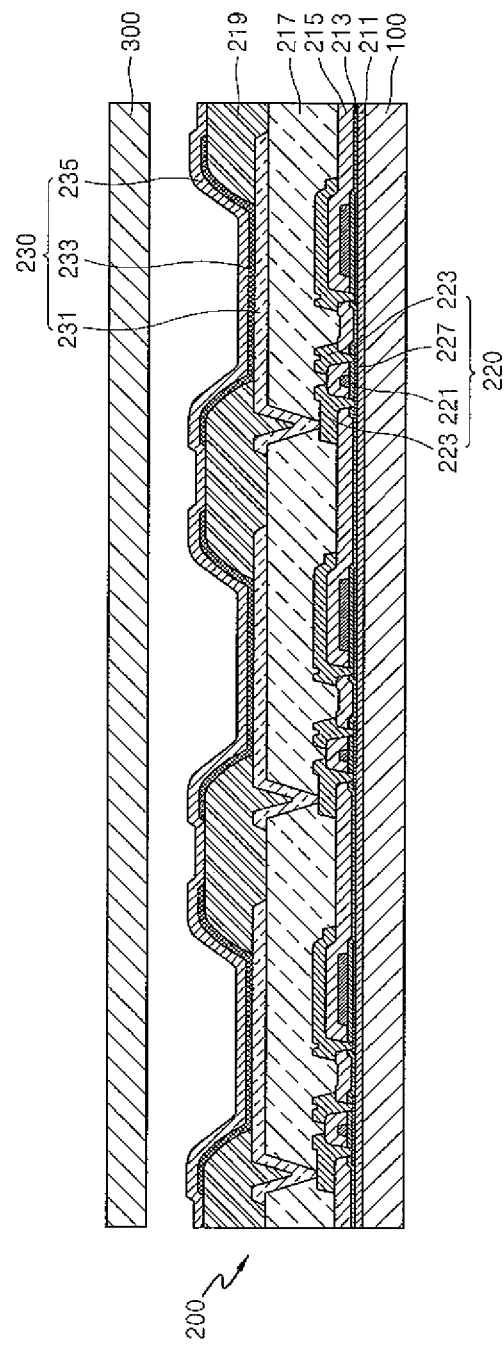
FIG. 2 is a magnified cross-sectional view of the display unit of the organic light emitting display apparatus of FIG. 1, according to an embodiment.
Figure 3A:
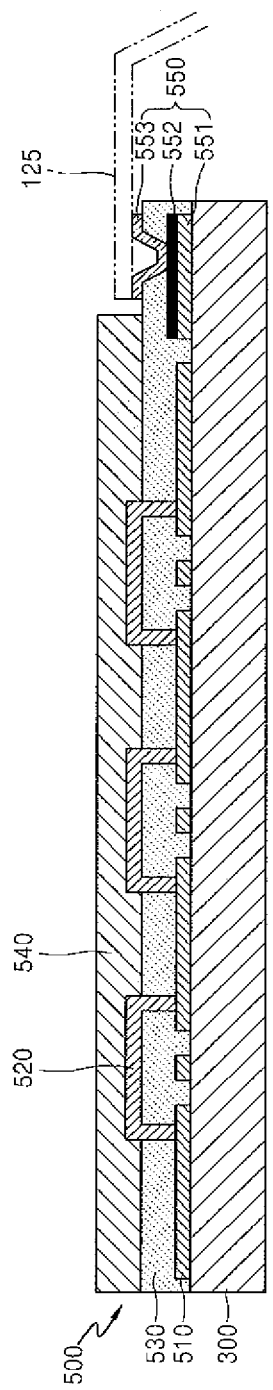
FIGS. 3A and 3B are respectively a cross-sectional view and a plan view of a sealing substrate and a touch unit formed on a surface thereof in the organic light emitting display apparatus of FIG. 1, according to an embodiment.

FIG. 1 is a cross-sectional view of an organic light emitting display apparatus according to an embodiment. FIG. 2 is a magnified cross-sectional view of a display unit 200 disposed on a substrate 100 of the organic light emitting display apparatus of FIG. 1, according to an embodiment. FIG. 3A is a cross-sectional view of a touch unit 500 disposed on a sealing substrate 300 of the organic light emitting display apparatus of FIG. 1, according to an embodiment.

Referring to FIG. 1, the display unit 200 including an organic light emitting device is disposed on the substrate 100.

The substrate 100 may comprise a transparent glass material that includes $SiO_2$, but is not limited thereto. For example, the substrate 100 may comprise a transparent plastic material. Examples of plastic materials suitable for the substrate 100 may be an insulating organic material, and may be, for example polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP) or combinations thereof.

In the case of a bottom emission-type displaying apparatus in which an image is displayed towards the substrate 100, the substrate 100 may comprise a transparent material. However, in the case of a top emission-type displaying apparatus in which an image is displayed away from the substrate 100, the substrate 100 does not have to comprise a transparent material. In this case, the substrate 100 may comprise metal. When the substrate 100 comprises metal, the substrate 100 may include for example, carbon (C), iron (Fe), chromium (Cr), manganese (Mn), nickel (Ni), titanium (Ti), molybdenum (Mo), stainless steel (SUS), an invar alloy, an inconel alloy, a kovar alloy or combinations thereof, but is not limited thereto.

In some embodiments, the substrate 100 may comprise a metal foil.

A buffer layer 211 (see FIG. 2) may be disposed on the substrate 100 in order to make the substrate 100 smooth and prevent the penetration of impurities.

The substrate 100 on which the display unit 200 is disposed is adhered to the sealing substrate 300 disposed above the display unit 200. The sealing substrate 300 may also comprise various plastic materials in addition to a glass material. The sealing substrate 300 may also be a metal plate.

Referring to FIG. 1, the substrate 100 and the sealing substrate 300 are adhered to each other by a sealant 250. The sealant 250 may be any sealant, for example, sealing glass frit. In addition, the sealant 250 may be an organic sealant, an inorganic sealant, an organic/inorganic sealant, or a mixture thereof.

A structure of the display unit 200 of the organic light emitting display apparatus of FIG. 1 will now be described.

FIG. 2 is a magnified cross-sectional view of the organic light emitting display apparatus of FIG. 1, and illustrates the structure of the display unit 200 according to one embodiment.

Referring to FIG. 2, a plurality of thin film transistors (TFTs) 220 are disposed on the substrate 100, and a plurality of organic light emitting devices 230 are formed on the TFTs 220. The organic light emitting device 230 includes a pixel electrode 231 that is electrically connected to the TFT 220, an opposite electrode 235 that is disposed on the entire surface of the substrate 100, and an intermediate layer 233 that is disposed between the pixel electrode 231 and the opposite electrode 235 and includes at least an emission layer.

The TFT 220 including a gate electrode 221, source and drain electrodes 223, a semiconductor layer 227, a gate insulating layer 213, and an interlevel insulating layer 215 is disposed on the substrate 100. The TFT 220 is not limited to the structure shown in FIG. 2. Various TFTs such as an organic TFT in which the semiconductor layer 227 comprises an organic material, and a silicon TFT comprising silicon may be used. In some embodiments, a buffer layer 211 comprising silicon oxide or silicon nitride may be disposed between the TFT 220 and the substrate 100.

The organic light emitting device 230 includes the pixel electrode 231 and the opposite electrode 235 that face each other, and the intermediate layer 233 disposed between the pixel electrode 231 and the opposite electrode 235 and comprising an organic material. In addition, the intermediate layer 233 may include at least an emission layer. In some embodiments, the intermediate layer 233 may also include a plurality of layers.

The pixel electrode 231 functions as an anode, and the opposite electrode 235 functions as a cathode. Polarities of the pixel electrode 231 and the opposite electrode 235 may be opposite to each other.

The pixel electrode 231 may be a transparent or reflective electrode. When the pixel electrode 231 is a transparent electrode, the pixel electrode 231 may comprise, for example, indium tin oxide (ITO), indium zinc oxide (IZO), ZnO or $In_2O_3$. When the pixel electrode 231 is a reflective electrode, the pixel electrode 231 may include a reflective layer comprising, for example, silver (Ag), magnesium (Mg), aluminium (Al), platinum (Pt), palladium (Pd), gold (Au), nickel (Ni), iridium (Ir), chromium (Cr), or a compound thereof, and a layer comprising, for example, ITO, IZO, ZnO or $In_2O_3$ on the reflective layer.

The opposite electrode 235 may be a transparent electrode or a reflective electrode. When the opposite electrode 235 is a transparent electrode, the opposite electrode 235 includes a layer on which lithium (Li), calcium (Ca), LiF/Ca, LiF/Al, aluminium (Al), magnesium (Mg), or a compound thereof is deposited so as to face the intermediate layer 233 between the pixel electrode 231 and the opposite electrode 235. In some embodiments, the opposite electrode can further comprise an auxiliary electrode (not shown) or a bus electrode line (not shown) that is formed on the layer and is comprises a material for forming a transparent electrode, such as ITO, IZO, ZnO or $In_2O_3$. When the opposite electrode 235 is a reflective electrode, the opposite electrode 235 may be formed by depositing, for example, Li, Ca, LiF/Ca, LiF/Al, Al, Mg or a compound thereof on the intermediate layer 233.

A pixel defining layer (PDLs) 219 may be disposed so as to cover edges of the pixel electrode 231. A thickness of the pixel defining layer (PDLs) 219 may vary on the edges of the pixel electrode 231. The PDL 219 defines an emission area. In addition, the PDL 219 widens an interval between an edge of the pixel electrode 231 and the opposite electrode 235 to prevent an electric field from concentrating on the edges of the pixel electrode 231, thereby preventing short circuits from occurring between the pixel electrode 231 and the opposite electrode 235.

Various intermediate layers 233 including at least an emission layer are each disposed between the pixel electrode 231 and the opposite electrode 235. The intermediate layer 233 may comprise a low molecular weight organic material or a high molecular weight organic material.

When the intermediate layers 233 comprises a low molecular weight organic material, the intermediate layers 233 may be formed by stacking a hole injection layer (HIL), a hole transport layer (HTL), an emission layer (EML), an electron transport layer (ETL), and an electron injection layer (EIL) in a single or composite structure. An organic material used for forming the intermediate layers 233 may be copper phthalocyanine (CuPc), N,N'-Di(naphthalene-1-yl)-N,N-diphenyl-benzidine (NPB), tris(8-hydroxyquinoline) aluminum (Alq3), or the like. The intermediate layers 233 comprising a low molecular weight organic material may be formed using a vacuum deposition method.

When the intermediate layer 233 comprises a high molecular weight organic material, the intermediate layers 233 may mostly have a structure including a HTL and an EML. In this case, the HTL may comprise polyethylenedioxythiophene (PEDOT), and the EML may comprise a high molecular weight organic material such as polyphenylenevinylenes (PPVs) or polyfluorenes.

The organic light emitting device 230 is electrically connected to the TFT 220 disposed below the organic light emitting device 230. In this case, when a planarization layer 217 covering the TFT 220 is provided, the organic light emitting device 230 is disposed on the planarization layer 217, and the pixel electrode 231 of the organic light emitting device 230 is electrically connected to the TFT 220 through a contact hole 531 (see FIG. 5A) formed through the planarization layer 217.

The organic light emitting device 230 formed above the substrate 100 is sealed by the sealing substrate 300. The sealing substrate 300 may comprise various materials such as glass or plastic.

The touch unit 500 formed on a surface of the sealing substrate 300 will now be described.

Figure 3B:
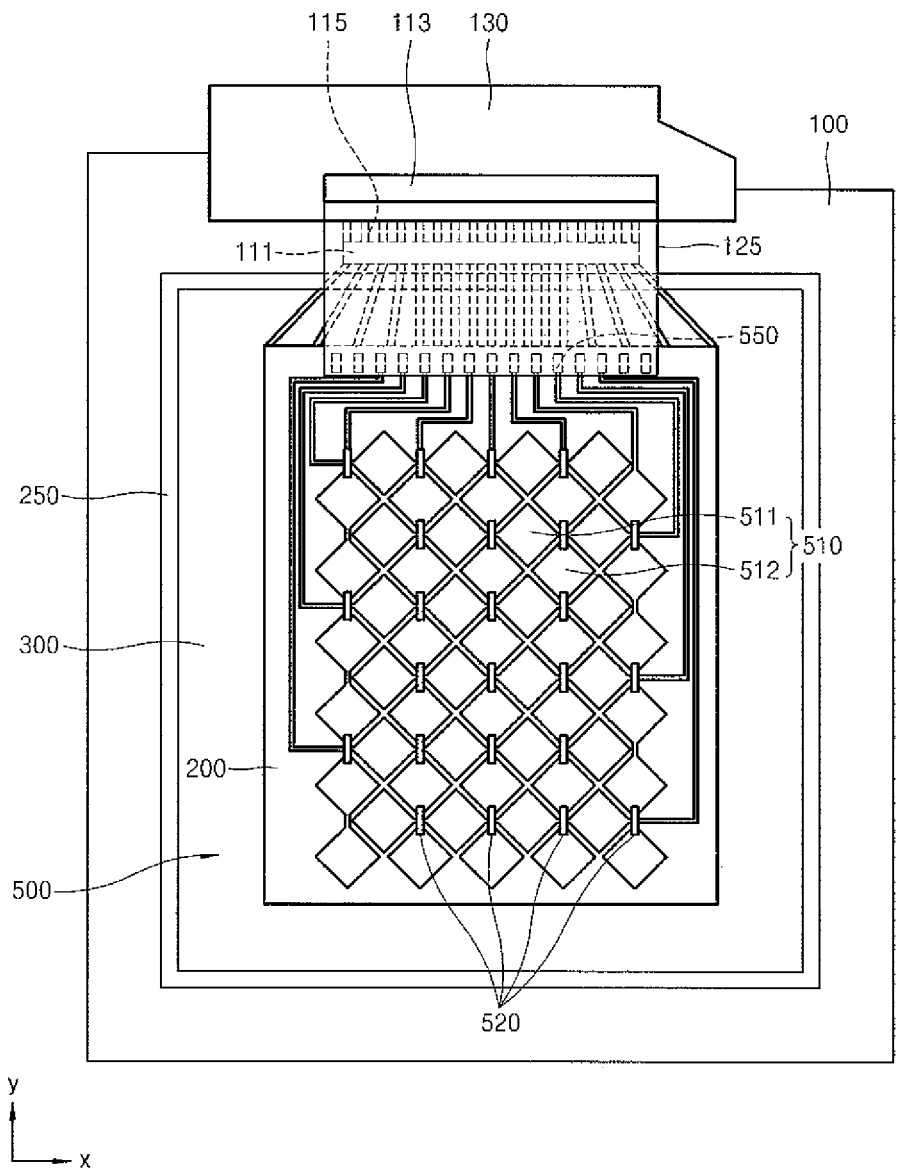

FIGS. 3A and 3B are respectively a cross-sectional view and a plan view of the sealing substrate 300 and the touch unit 500 formed on a surface thereof in the organic light emitting display apparatus of FIG. 1, according to an embodiment.

FIGS. 4A through 7 are cross-sectional views for explaining a method of manufacturing the organic light emitting display apparatus of FIG. 1, according to an embodiment. In FIGS. 3A through 7, the reference numeral 550 denotes a connection portion to which a connector 125 is connected. The connection portion 550 is a pad region of the touch unit 500 where an image is not formed. In addition, a region where a pattern layer is formed is a pixel region where an image is realized by touch manipulation.

Referring to FIGS. 3A and 3B, a first pattern layer 510, a first insulating layer 530, a second pattern layer 520, and a second insulating layer 540 are sequentially formed on a surface the sealing substrate 300, which is an opposite surface to a surface facing the display unit 200 (see FIG. 1).

The first pattern layer 510 is formed on the sealing substrate 300. The first pattern layer 510 includes a plurality of first direction pattern portions 511 (see FIG. 3B) that are formed parallel to each other in a first direction (e.g., the X direction as shown in FIG. 3B), and a plurality of second direction pattern portions 512 that are formed parallel to each other in a second direction (e.g., the Y direction as shown in FIG. 3B) that is substantially perpendicular to the first direction. As shown in FIG. 3B, the first direction pattern portions 511 and the second direction pattern portions 512 are alternately disposed. That is, the first direction pattern units 511 are formed parallel to each other in the first direction (i.e., the X direction of FIG. 3B) on the sealing substrate 300 so that edges of the first direction pattern units 511 may face each other, and the second direction pattern portions 512 are formed substantially parallel to each other between the first direction pattern units 511 in the second direction (e.g., the Y direction of FIG. 3B) on the sealing substrate 300 so that edges of the second direction pattern units 512 may face each other.

Figure 4A:
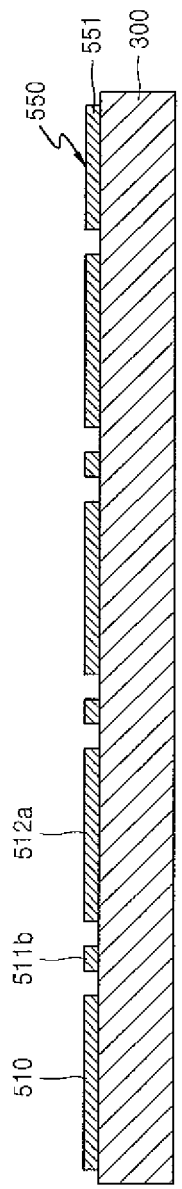
FIGS. 4A through 7 are cross-sectional views illustrating a method of manufacturing the organic light emitting display apparatus of FIG. 1, according to an embodiment.
Figure 4B:
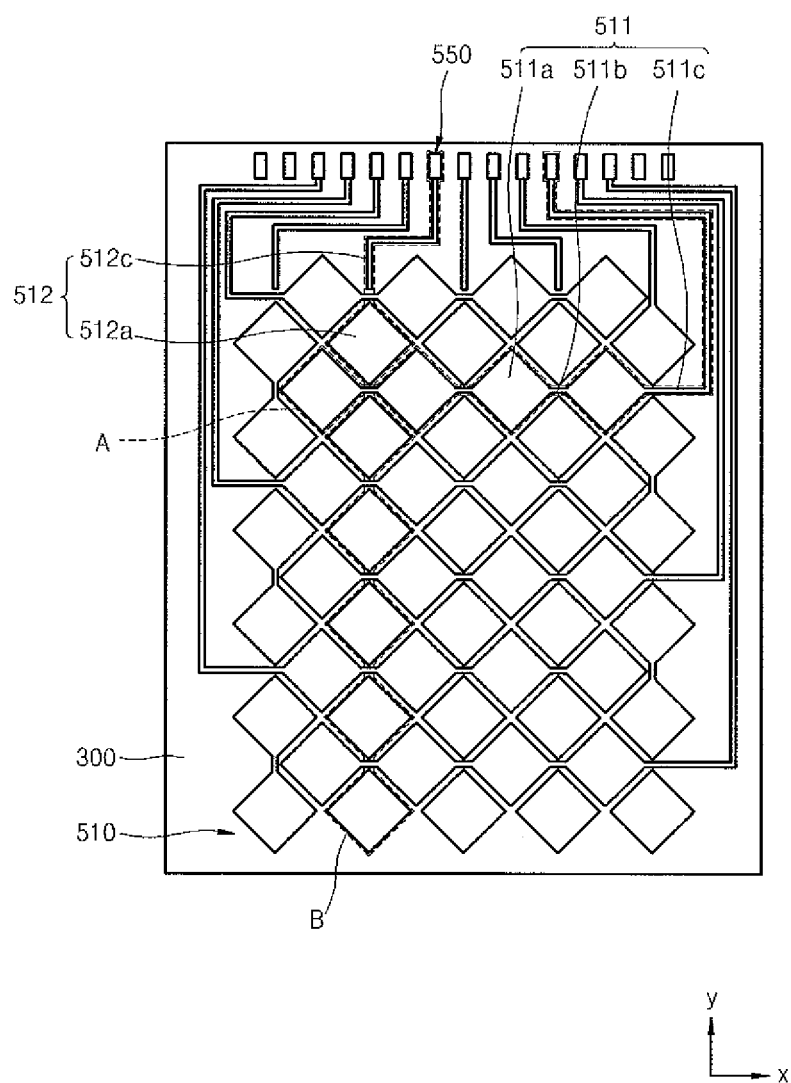

The first pattern layer 510 may be formed on the sealing substrate 300, for example, by using deposition and photolithography methods, as shown in FIGS. 4A and 4B. Reference numeral 550 represents a connection portion to which the connector 125 (see FIG. 1) for connecting a touch panel drive integrated circuit (IC) 113 (see FIG. 1) and the touch unit 500. The connection portion 550 is formed together with the first and second pattern layers 510 and 520, and the first and second insulating layers 530 and 540 (see FIG. 3A).

With reference to the dotted line 'A' of FIG. 4B for indicating one first direction pattern portion 511 of the first pattern layer 510 formed on the sealing substrate 300, the first direction pattern portion 511 includes a plurality of body portions 511a, a plurality of connection portions 511b, and extension portion 511c. The body portions 511a may each have generally a diamond shape, and are formed in rows in a first direction, for example, the X direction of FIG. 4B. The connection portions 511b are formed between the neighboring portions 511a, and connect the neighboring portions 511a to each other. The extension portions 511c extend from ends of the first direction pattern portions 511. The extension portions 511c extend in a direction, for example, the Y direction of FIG. 4B so that all of the extension portions 511c may extend towards one end of the sealing substrate 300, for example, the upper portion of FIG. 4B. In addition, the connection portions 550 are formed at ends of the extension portions 511c, respectively. The connection portions 550 are electrically connected to a flexible printed circuit board 130 (see FIG. 1) through the connector 125 (see FIG. 1).

With reference to the dotted line 'B' of FIG. 4B for indicating one second direction pattern portion 512, the second direction portion 512 includes a plurality of body portions 512a and an extension portion 512c. The body portions 512a may each have generally a diamond shape, and are formed in rows in a second direction, for example, the Y direction of FIG. 4B.

Unlike the first direction pattern portions 511, the second direction portions 512 do not include a connection portion. The body portions 512a are connected to each other by the second pattern layer 520 (see FIG. 6A) including a plurality of third pattern portions 525 (see FIG. 6A) for connecting the body portions 512a, not by connection portions as in the pattern portion 511.

The extension portion 512c extends from one end of the second direction pattern portion 512 towards one direction, for example, the Y direction of FIG. B so that all of the extension portions 512c may extend towards one end of the sealing substrate 300, for example, an upper portion of 4B. In addition, an end of the extension portion 512c is connected to the connection portion 550.

Figure 5B:
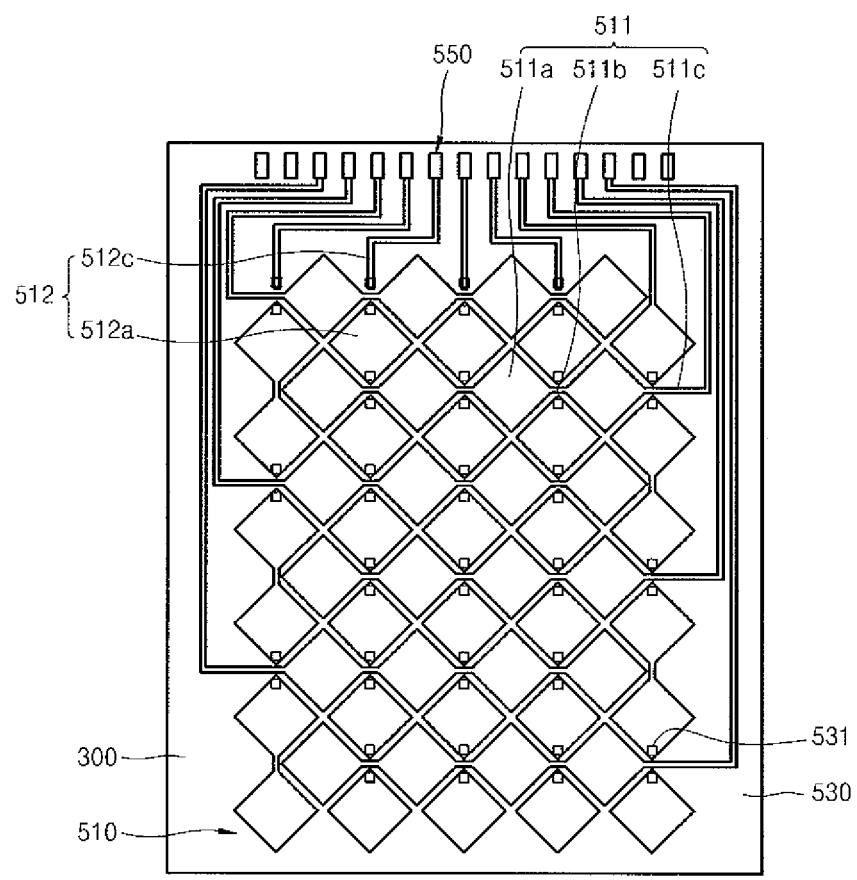

Referring to FIGS. 5A and 5B, the first insulating layer 530 is formed on the sealing substrate 300 so as to cover the first pattern layer 510. The first insulating layer 530 insulates the first pattern layer 510 and the second pattern layer 520 (see FIG. 3B) from each other. Contact holes 531 are formed in predetermined portions of the first insulating layer 530, for example, portions corresponding to the facing edges of the body portions 512a of the second direction pattern portions 512. The body portions 512a of the second direction pattern portions 512 are electrically connected to the second pattern layer 520 through the contact holes 531.

Figure 6A:
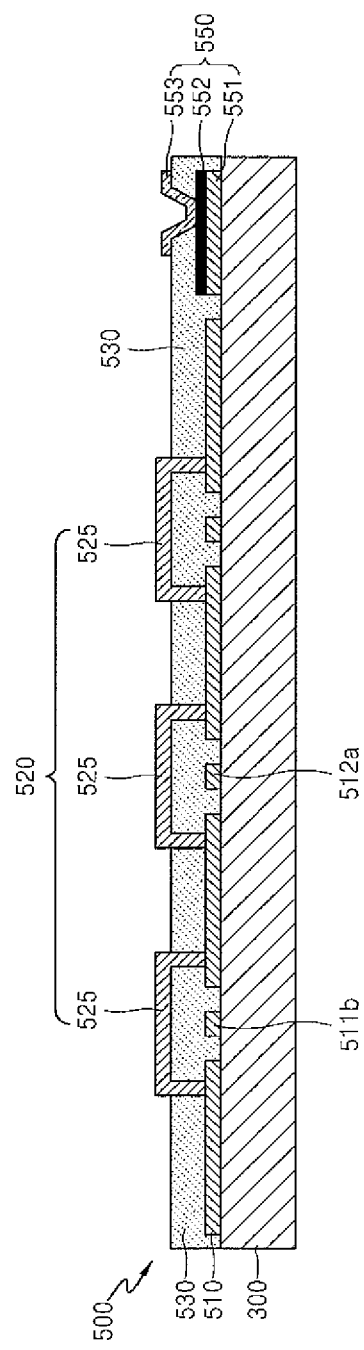
Figure 6B:
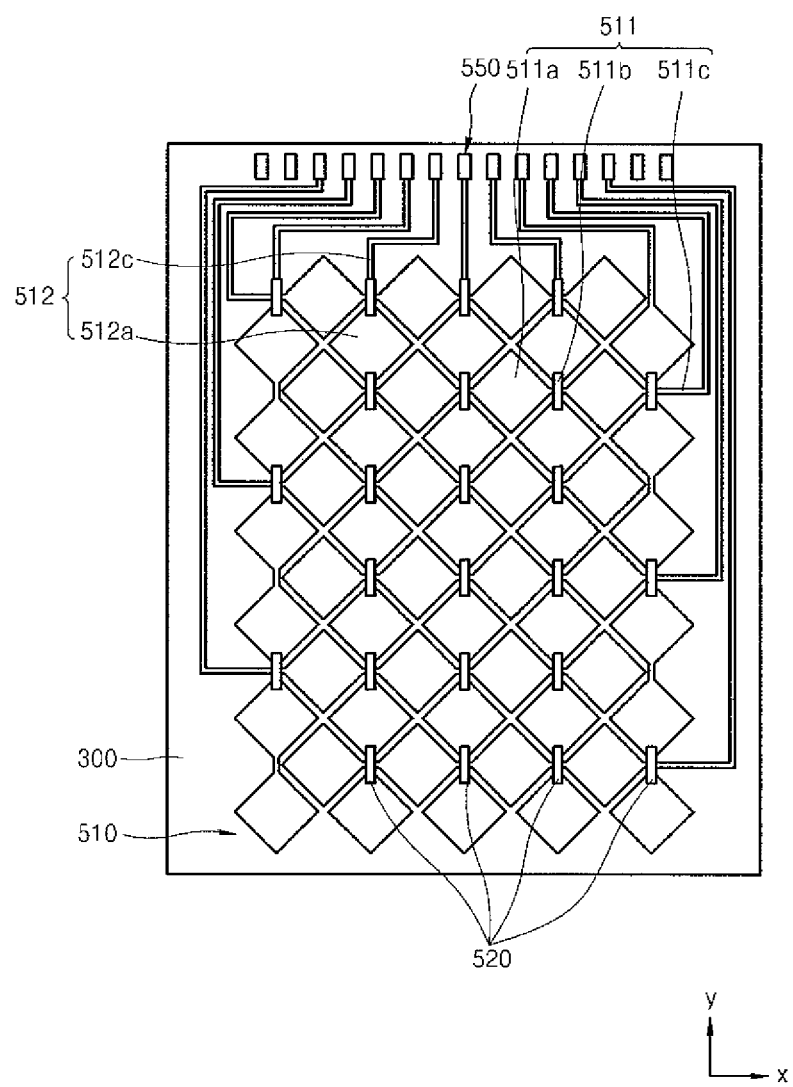
Figure 6C:
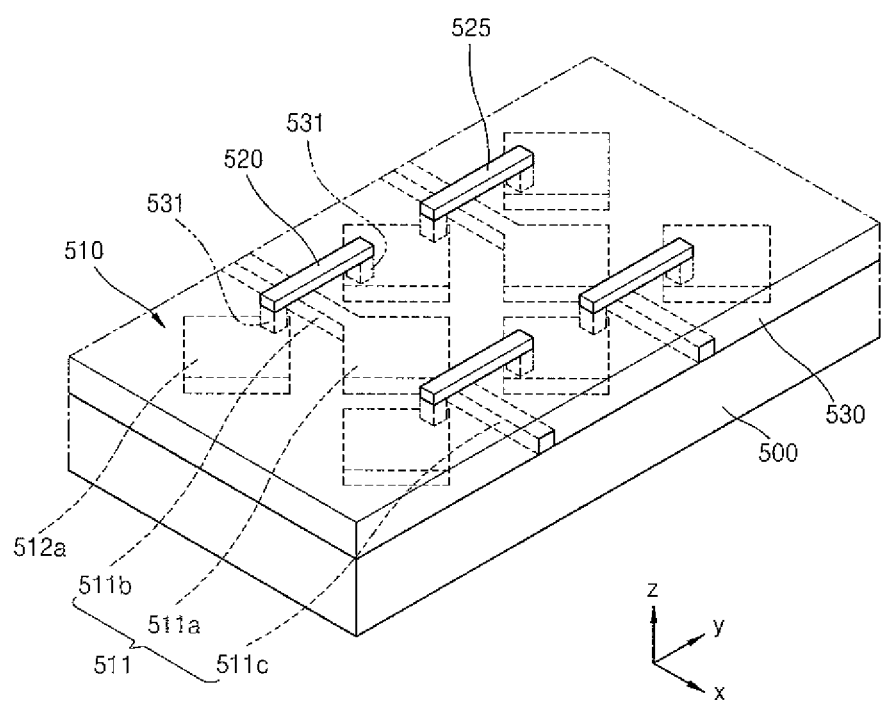

Referring to FIGS. 6A through 6C, the second pattern layer 520 is formed on the first insulating layer 530. In this case, the second pattern layer 520 is formed so as to fill the contact holes 531 of the first insulating layer 530 so that the neighboring body portions 512 of the second direction pattern portions 512 may be electrically connected to each other through the third pattern portions 525.

Due to the above-described structure, the first direction pattern portions 511 and the second direction pattern portions 512 that are formed perpendicular to each other may not cross each other, thereby preventing short circuits from occurring between the first direction pattern portions 511 and the second direction pattern portions 512.

The first pattern layer 510 and the second pattern layer 520 may comprise a transparent material, for example, ITO, IZO, ZnO or $In_2O_3$. The first pattern layer 510 and the second pattern layer 520 may be formed using a photolithography method. That is, the first pattern layer 510 and the second pattern layer 520 may be formed by patterning an ITO layer formed by using methods such as deposition, spin coating, or inkjet.

The second insulating layer 540 (see FIG. 3A) is formed on the first insulating layer 530 so as to cover the second pattern layer 520. The second insulating layer 540 protects the second pattern layer 520. The first and second insulating layers 530 and 540 may comprise, for example, $SiO_2$.

Through the above-described operations, a structure of the pixel region for touch manipulation can be prepared.

As described above, the pad region including the connection portion 550 to which the connector 125 is connected can be simultaneously formed with the pixel region.

A method of manufacturing the organic light emitting display apparatus of FIG. 1 will be summarized.

Referring to FIG. 1, the connection portions 550 formed on the pad region of the sealing substrate 300 may be electrically connected to the touch panel drive IC 113 formed on the flexible printed circuit board 130. To achieve this, the connector 125 can be disposed between the connection portions 550 and the touch panel drive IC 113.

The display unit 200 where an image is realized is formed on the substrate 100. The flexible printed circuit board 130 including various electrical components for driving and controlling the display unit 200 is formed on one side of the display unit 200. The various electrical components for driving and controlling the display unit 200 are disposed on the flexible printed circuit board 130. A display drive IC 111 for driving the display unit 200 is disposed between the display unit 200 and the flexible printed circuit board 130. The display drive IC 111 and the flexible printed circuit board 130 may be connected by input and output wirings 115.

The connector 125 transmits an electrical signal generated by the first and second pattern layers 510 and 520 formed on an external surface of the sealing substrate 300 to the flexible printed circuit board 130. The connection portion 550 formed on the sealing substrate 300 may contact an end of the connector 125 so as to be electrically connected to the connector 550. The touch panel drive IC 113 formed on the flexible printed circuit board 130 is electrically connected to the other end of the connector 12. Alternatively, the connector 125 is manufactured as a flexible board, and a touch panel drive IC may be disposed on the connector 125. In this case, various members such as flexible printed circuit board may be used as the connector 125. The touch panel drive IC 113 receives the electrical signal generated by the first and second pattern layers 510 and 520 formed on the sealing substrate 300 to drive and control a touch panel.

Due to the above-described structure, a one body-type interface for performing a touch panel function by using a flexible printed circuit board may be prepared to reduce manufacturing costs and to increase manufacturing convenience and user's convenience.

In addition, the display drive IC 111 and the touch panel drive IC 113 are separately disposed in FIG. 1, but embodiments of the present invention are not limited thereto. Although not illustrated, the display drive IC may perforin the function of the touch panel drive IC. Due to the above-described structure, manufacturing costs may be reduced, and the manufacturing convenience and user's convenience may be increased.

A process of manufacturing the organic light emitting display apparatus including the pad region will proceed as follows.

As shown in FIGS. 4A and 4B, the first pattern layer 510 is formed on the sealing substrate 300. The first direction pattern portion 511 and the second direction pattern portion 512 of the first pattern layer 510 are formed on the pixel region. A first connection layer 551 is formed on the pattern region. Subsequent patterning processes including patterning of the first pattern layer 510 may be performed using a photolithography method.

Then, as shown in FIGS. 5A and 5B, a second connection layer 552 as a metal layer is formed on the first connection layer 551 of the pattern region. Since contact errors may be arisen when etching is excessively performed on the first connection layer 551 during the etching of the contact hole 531, the second connection layer 552 is formed on the first connection layer 551 in order to protect the first connection layer 551. Then, the first insulating layer 530 is formed, and the contact hole 531 is formed. Then, in the pixel region, the second pattern layer 520 for connecting the second direction pattern portions 512 fills the contact hole 531. In the pattern region, the third connection layer 553 fills the contact hole 531 that is a terminal to which the connector 125 is connected.

As shown in FIGS. 6A and 6B, the second pattern layer 520 is formed on the first insulating layer 530. In this case, while the contact hole 531 is filled with the second pattern layer 520, the third pattern portion 525 for connecting the body portions 512a of the second direction pattern portion 512 is formed in the pixel region, and the third connection layer 553 to which the connector 125 is connected is formed in the pad region.

Figure 7:
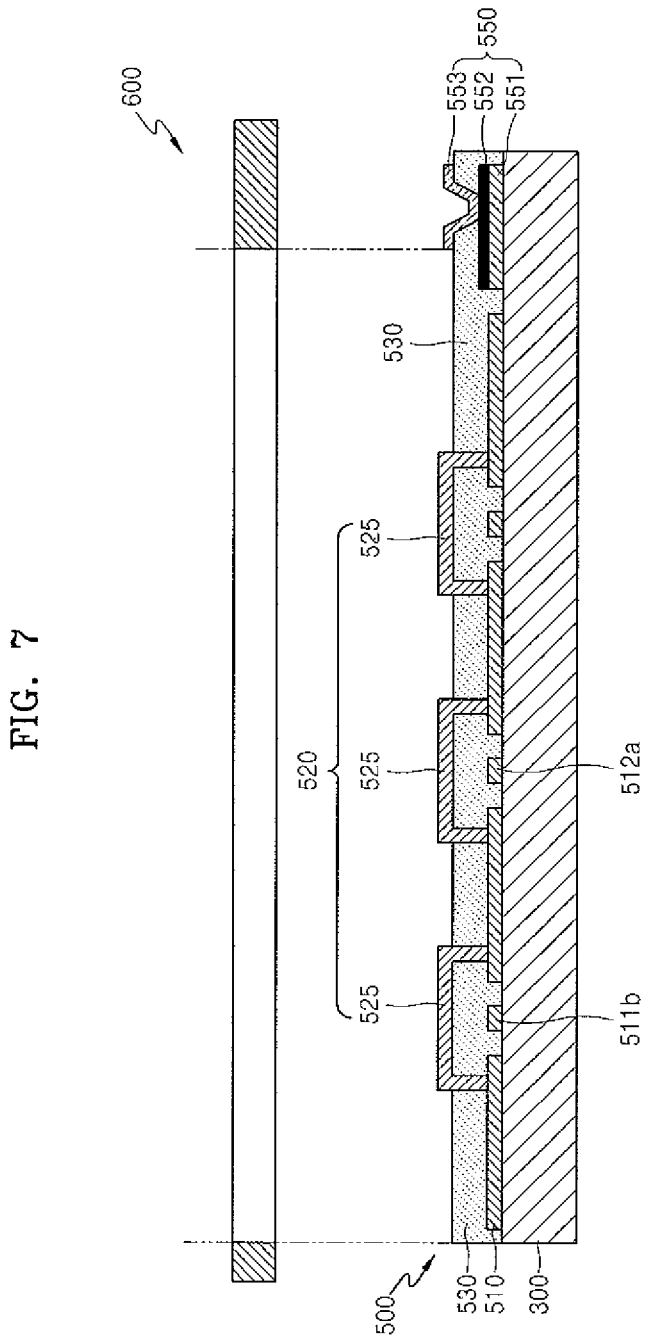

Then, the second insulating layer 540 is formed on the second pattern layer 520. The second insulating layer 540 is in the pixel region, but is not required in the pad region. Since the connection portion 550 should be exposed for connection with the connector 125 (e.g., a cable) in the pixel region, the second insulating layer 540 is formed only on the pixel region. To achieve this, an open mask 600 of FIG. 7 is used instead of using a photolithography method. The open mask 600 corresponds to the pixel region, and when it is closed, the open mask 600 corresponds to the pad region. When the second insulating layer 540 is formed using the open mask 600, the second insulating layer 540 is formed on only the pixel region, as shown in FIG. 3A. Then, the connector 125 is connected to the exposed portion of the connection portion 550.

When the mask 600 is opened during the formation of the second insulating layer 540, one operation of a photolithography method may be omitted, thereby simplifying manufacturing processes. If the second insulating layer 540 is formed using a photolithography method, various operations should be performed, for example, first the second insulating layer 540 is entirely formed, then a portion of the second insulating layer 540 corresponding to the pad region is exposed using a shadow mask, and then the portion of the second insulating layer 540 is etched. However, when the open mask 600 is used, the second insulating layer 540 is formed using a single deposition operation, thereby simplifying manufacturing processes.

When fingers, conductive objects, or high dielectric materials contact a surface of the organic light emitting display apparatus manufactured as described above, the organic light emitting display apparatus recognizes a change in capacitance of a pattern layer due to the contact, and detects a touch.

Thus, the organic light emitting display apparatus may have a touch pad function, and may be simply manufactured with improved production efficiency.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. An organic light emitting display apparatus comprising:
a substrate;
a display unit formed on the substrate;
a sealing substrate covering the display unit; and
a touch unit formed on the sealing substrate, wherein the touch unit comprises a pixel region comprising at least one surface, a pad region comprising at least one surface, and
first and second insulating layers,
wherein the first insulating layer is formed on the surface of the pad region and the second insulating layer is formed only on the entire surface of the pixel region of the touch unit,
wherein the insulating layer is formed using an open mask that corresponds to the pixel regions, wherein the open mask corresponds to the pad regions when it is closed;
wherein the pad region comprises a connection portion comprising, a first connection layer comprising indium tin oxide (ITO) formed on the sealing substrate, a second connection layer comprising a metal material formed on the first connection layer, and a third connection layer comprising ITO formed on the second connection layer.

2. The organic light emitting display apparatus of claim 1, wherein the connection portion is connected to a cable.

3. The organic light emitting display apparatus of claim 2, wherein the third connection layer contacts the cable.

4. The organic light emitting display apparatus of claim 3, wherein the first insulating layer is formed on the second connection layer, and
the third connection layer is connected to the second connection layer through a contact hole formed through the first insulating layer formed on the second connection layer.

5. The organic light emitting display apparatus of claim 2, further comprising a flexible printed circuit board connected to the cable.

6. The organic light emitting display apparatus of claim 5, further comprising a display drive integrated circuit (IC) and a touch unit drive IC that are connected to the flexible printed circuit board.

7. The organic light emitting display apparatus of claim 1, wherein the pixel region comprises a first pattern layer formed on a first surface of the sealing substrate,
wherein the first insulating layer is formed on the first pattern layer, and wherein a second pattern layer is formed between the first insulating layer and the second insulating layer.

8. The organic light emitting display apparatus of claim 7, wherein the first surface of the sealing substrate of the pixel region faces away from the substrate and a second surface of the sealing substrate faces toward the substrate.

9. The organic light emitting display apparatus of claim 7, wherein the first pattern layer comprises a first direction pattern portion and a second direction pattern portion that are disposed substantially perpendicularly to each other.

10. The organic light emitting display apparatus of claim 9, wherein any one of the first direction pattern portion and the second direction pattern portion is connected to the second pattern layer.

11. The organic light emitting display apparatus of claim 10, wherein the second pattern layer is connected to any one of the first direction pattern portion and the second direction pattern portion through a contact hole formed through the first insulating layer.

12. The organic light emitting display apparatus of claim 7, wherein the first and second pattern layers each comprise ITO.

13. The organic light emitting display apparatus of claim 7, wherein the first and second pattern layers each comprise a transparent material, and
wherein the first insulating layer and the second insulating layer comprise a SiO2 material.

14. The organic light emitting display apparatus of claim 13, wherein the first and second pattern layers each comprise ITO, IZO, ZnO or In2O3.

15. The organic light emitting display apparatus of claim 1, wherein the display unit comprises:
a thin film transistor formed on the substrate; and
an organic light emitting device coupled to the thin film transistor,
wherein the organic light emitting device comprises an opposite electrode, a pixel electrode, and an intermediate layer formed between the opposite electrode and the pixel electrode.

16. A method of manufacturing an organic light emitting display apparatus, the method comprising:
- providing a substrate;
- disposing a display unit on the substrate;
- preparing a sealing substrate for covering the display unit disposed on the substrate;
- forming a touch unit comprising a pixel region for touch manipulation, and a pad region for connection with a cable,
- wherein the forming of the touch unit comprises:
    - forming a connection portion in the pad region to which the cable is connected;
    - positioning an open mask that is closed to correspond to the pad region and is open to correspond to the pixel region; and
    - forming a first insulating layer on the entire pixel region and not on the pad region through the open portion of the open mask.

17. The method of claim 16, wherein the forming of the connection portion comprises:
- forming a first connection layer on the sealing substrate;
- forming a second connection layer comprising metal on the first connection layer; and
- forming a third connection layer on the second connection layer so as to be exposed to contact the cable.

18. The method of claim 17, further comprising:
- forming a second insulating layer on the second connection layer;
- forming a contact hole in the insulating layer formed on the second connection layer; and
- connecting the third connection layer and the second connection layer through the contact hole.

* * * * *